US010199350B2

(12) United States Patent
Wan et al.

(10) Patent No.: US 10,199,350 B2
(45) Date of Patent: Feb. 5, 2019

(54) APPARATUS FOR HEATING A SUBSTRATE DURING DIE BONDING

(75) Inventors: Ming Yeung Luke Wan, Kwai Chung (HK); Chi Wai Cheung, Kwai Chung (HK); Chin Tung So, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 671 days.

(21) Appl. No.: 13/480,622

(22) Filed: May 25, 2012

(65) Prior Publication Data

US 2013/0316294 A1    Nov. 28, 2013

(51) Int. Cl.
*F27D 3/00*    (2006.01)
*F27D 15/02*    (2006.01)
*H01L 23/00*    (2006.01)

(52) U.S. Cl.
CPC .............. *H01L 24/83* (2013.01); *H01L 24/75* (2013.01); *H01L 24/81* (2013.01); *H01L 2224/751* (2013.01); *H01L 2224/755* (2013.01); *H01L 2224/75251* (2013.01); *H01L 2224/75281* (2013.01); *H01L 2224/75501* (2013.01); *H01L 2224/81054* (2013.01); *H01L 2224/81801* (2013.01); *H01L 2224/83054* (2013.01); *H01L 2224/83801* (2013.01); *H01L 2924/0132* (2013.01); *H01L 2924/01322* (2013.01)

(58) Field of Classification Search
CPC ......... H01L 2224/751; H01L 2224/755; H01L 2224/75281; H01L 2224/83075; H01L 2224/81075; H01L 2224/75251; H01L 2224/81054; H01L 2224/83054

USPC .... 432/9, 77, 81, 225, 121, 135, 254.1, 258, 432/259; 219/221; 118/58–69
See application file for complete search history.

(56) References Cited

U.S. PATENT DOCUMENTS

| 4,300,715 | A | * | 11/1981 | Keizer | H01L 21/67138 219/85.16 |
|---|---|---|---|---|---|
| 4,797,994 | A | * | 1/1989 | Michaud et al. | 29/720 |
| 4,961,805 | A | * | 10/1990 | Siebert | 156/251 |
| 5,213,742 | A | * | 5/1993 | Conston | A61F 2/0077 264/156 |
| 5,316,204 | A | * | 5/1994 | Takehashi et al. | 228/179.1 |
| 5,549,716 | A | * | 8/1996 | Takahashi et al. | 29/25.01 |
| 5,668,058 | A | * | 9/1997 | Tanioka et al. | 438/108 |
| 5,984,165 | A | * | 11/1999 | Inoue et al. | 228/180.22 |
| 6,102,273 | A | * | 8/2000 | Satoh | 228/42 |

(Continued)

*Primary Examiner* — Steven B McAllister
*Assistant Examiner* — Steven Anderson, II
(74) *Attorney, Agent, or Firm* — Ostrolenk Faber LLP (57) ABSTRACT

An apparatus for heating a substrate during die bonding is disclosed. The apparatus comprises: a substrate carrier configured to hold the substrate; a heating device configured to heat the substrate; a first actuator for effecting relative motion between the substrate carrier and the heating device such that the substrate is relatively indexed with respect to the heating device; a second actuator for effecting relative motion between the substrate carrier and the heating device such that the heating device contacts the substrate to heat different portions of the substrate. In particular, the second actuator is operative to separate the heating device from the substrate in order for the first actuator to relatively index the substrate across the heating device. A method of heating a substrate during die bonding is also disclosed.

14 Claims, 9 Drawing Sheets

(56) References Cited

U.S. PATENT DOCUMENTS

| | | | |
|---|---|---|---|
| 6,969,829 B2* | 11/2005 | Tsuruno et al. | 219/390 |
| 2002/0106603 A1* | 8/2002 | Foong et al. | 432/253 |
| 2003/0015569 A1* | 1/2003 | Wong et al. | 228/102 |
| 2003/0190574 A1* | 10/2003 | Schmid et al. | 432/121 |
| 2005/0081986 A1* | 4/2005 | Kwon et al. | 156/249 |
| 2006/0085965 A1* | 4/2006 | Suga et al. | 29/514 |
| 2008/0001268 A1* | 1/2008 | Lu | 257/678 |
| 2012/0091186 A1* | 4/2012 | Akiyama et al. | 228/44.3 |
| 2012/0111922 A1* | 5/2012 | Hwang | B23K 1/0012 228/6.2 |
| 2012/0234314 A1* | 9/2012 | Zolla | H01L 31/0322 126/85 R |
| 2012/0312863 A1* | 12/2012 | Sueoka | 228/104 |

\* cited by examiner

APPARATUS FOR HEATING A SUBSTRATE DURING DIE BONDING

FIELD OF THE PRESENT INVENTION

This invention relates to an apparatus for heating a substrate during die bonding. In particular, the apparatus includes a heating device for heating a plurality of bond pads on the substrate before semiconductor dies are bonded thereto. The invention also relates to a method of heating a substrate during die bonding.

BACKGROUND OF THE INVENTION

Eutectic die bonding requires heating a die solder layer or a die solder bump of a semiconductor die to a required temperature, before the semiconductor die is bonded to a substrate (e.g. a lead frame) via an interface between the heated die solder layer or bump and a substrate bond pad. The substrate is typically placed on a heated anvil to transfer heat from the heated anvil through the heat-conducting substrate to the substrate, to thereby heat the die solder layer or bump to the required temperature for eutectic die bonding.

Figure 1:
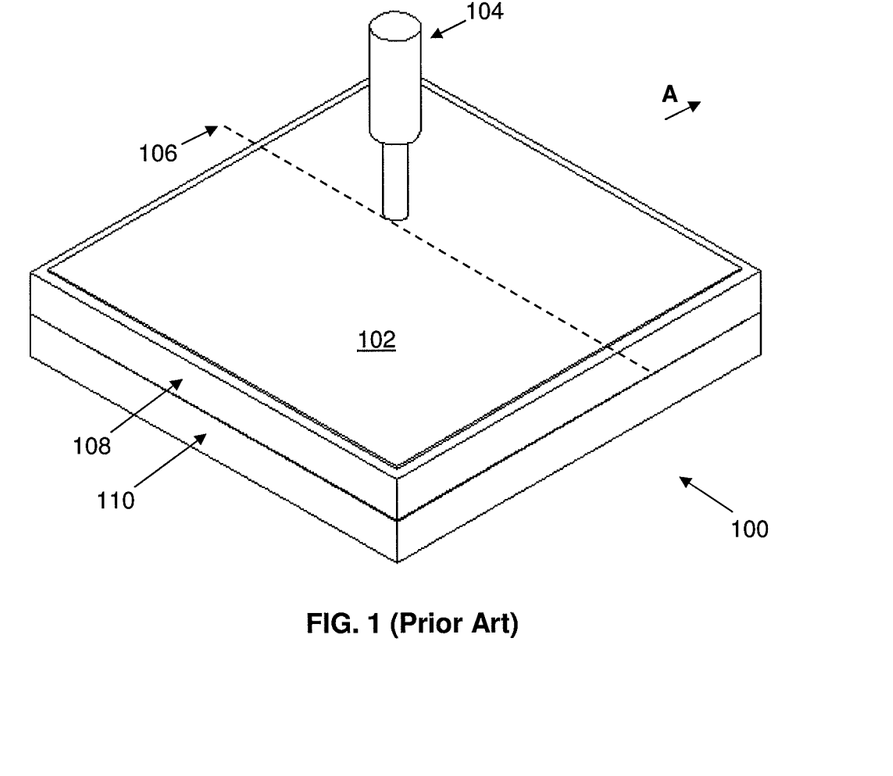
FIG. 1 shows a conventional indexing apparatus for heating a substrate during die bonding.

FIG. 1 shows a conventional indexing apparatus 100 for heating a substrate 102, which comprises an array of substrate bond pads (not shown) positioned relative to a die collet 104 of a die bonder for bonding along a bonding line 106. Specifically, the indexing apparatus 100 comprises: i) an anvil 108 for supporting the substrate 102; and ii) a workholder base 110 for supporting the anvil 108. In particular, the anvil 108 is maintained at a uniform temperature (e.g. 280° C. if the die solder layer or bump is made up of a gold-tin composite) throughout the eutectic die bonding process to heat the substrate bond pads. The apparatus 100 is also configured to index the substrate 102 along direction A shown in FIG. 1, so that successive rows of the substrate bond pads are aligned with the bond line 106 to receive semiconductor dies from the die collet 104. Since the entire substrate 102 is placed on the heated anvil 108 throughout the eutectic die bonding process, a pre-bond heating time and a post-bond heating time for each substrate bond pad will thus vary depending on its location on the substrate 102. This means that the substrate bond pads that receive the semiconductor dies earlier than other substrate bond pads would have a shorter pre-bond heating time and longer post-bond heating time. This, however, increases the likelihood of internal damage of thermally vulnerable semiconductor dies, such as LED devices, during eutectic bonding.

Thus, it is an object of the present invention to seek to propose an apparatus for indexing a substrate that at least reduces the likelihood of damage to semiconductor dies during die bonding.

SUMMARY OF THE INVENTION

A first aspect of the present invention is an apparatus for heating a substrate during die bonding. The apparatus comprises: a substrate carrier configured to hold the substrate; a heating device configured to heat the substrate; a first actuator for effecting relative motion between the substrate carrier and the heating device such that the substrate is relatively indexed with respect to the heating device; a second actuator for effecting relative motion between the substrate carrier and the heating device such that the heating device contacts the substrate to heat different portions of the substrate. In particular, the second actuator is operative to separate the heating device from the substrate in order for the first actuator to relatively index the substrate across the heating device.

Some preferred but optional features of the apparatus are defined in the dependent claims.

A second aspect of the invention is a method of heating a substrate during die bonding. The method comprises the steps of: contacting a heating device against the substrate to heat at least a portion of the substrate; separating the heating device from the substrate; and indexing the substrate relatively across the heating device after the heating device has been separated from the substrate.

Some preferred but optional steps of the method are also defined in the dependent claims.

BRIEF DESCRIPTION OF THE DRAWINGS

Embodiments of the invention will now be described, by way of example only, with reference to the accompanying drawings, of which:

FIG. 3 is a top view of the apparatus of FIG. 2 without showing a top cover, while

DETAILED DESCRIPTION OF THE PREFERRED EMBODIMENTS

Figure 2:
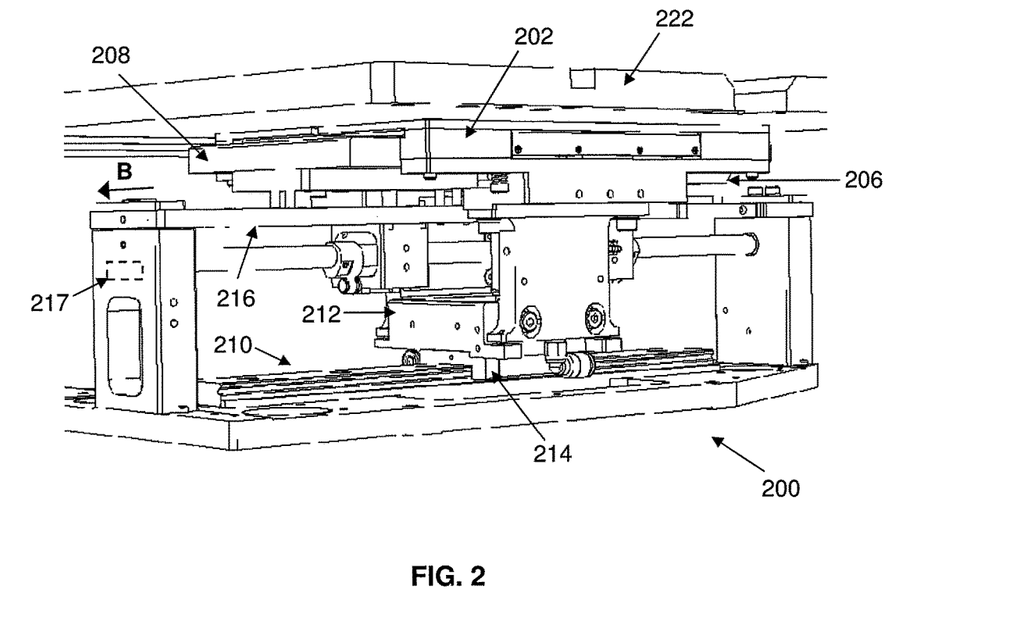
FIG. 2 shows an apparatus for heating a substrate during die bonding, according to an embodiment of the invention.

FIG. 2 shows a substrate-indexer 200 for indexing a substrate along an indexing direction B during die bonding. Specifically, the substrate-indexer 200 comprises: i) a substrate carrier 202 configured to hold a substrate; ii) a heating device (shown as a heating anvil block 206) configured to heat the substrate; iii) a cooling device (shown as a cooling anvil block 208), arranged adjacent to the heating anvil block 206, for cooling the substrate 204; and iv) a positioning device—in the form of first and second actuators—configured to index the substrate carrier 202 along direction B through a plurality of indexing positions first across the heating anvil block 206, and subsequently, across the cooling anvil block 208. In particular, the positioning device is operative to separate the substrate carrier 202 from the heating and cooling anvil blocks 206, 208, before the substrate carrier 202 is indexed to a new position. The positioning device is also operative to press the heating anvil block 206 and/or the cooling anvil 208 against the substrate 204 at the plurality of indexing positions, so as to achieve the desired effects of heating and/or cooling different portions of the substrate 204 during die bonding.

To index the substrate carrier 202 through the indexing positions, the first actuator includes: i) a horizontal linear guide 210 for guiding the substrate carrier 202; ii) an indexing mechanism 212, which is coupled to the horizontal linear guide 210 and the substrate carrier 202, for indexing the substrate 204 along the indexing direction B on a horizontal plane; iii) and a linear motor 214 operative to drive the indexing mechanism 212—and, thereby, the substrate carrier 202—along the horizontal linear guide 210.

To separate the substrate carrier 202 from the heating and cooling anvil blocks 206, 208, the second actuator includes: i) a movable anvil platform 216 coupled to the heating and cooling anvil blocks 206, 208; ii) and a motor 217 for driving the anvil platform 216 vertically between a top position to press the heating and/or cooling anvil blocks 206, 208 against different portions of the substrate 204, and a bottom position to separate the heating and/or cooling anvil blocks 206, 208 from the substrate 204.

Moreover, the substrate carrier 202 is connected to a shielding gas supply (not shown) and the substrate carrier 202 comprises carrier openings for introducing a shielding gas (e.g. an inert gas or a forming gas) onto the substrate 204 during die bonding. By introducing the shielding gas, the substrate 204 may be protected against oxidation and stronger bonds may be formed between the semiconductor dies and the respective substrate bond pads. To retain the volume of the shielding gas that envelopes the substrate 204, the substrate indexer 200 additionally comprises a top cover 222 for retaining the shielding gas within a space between the top cover 222 and the substrate carrier 202.

Figure 3A:
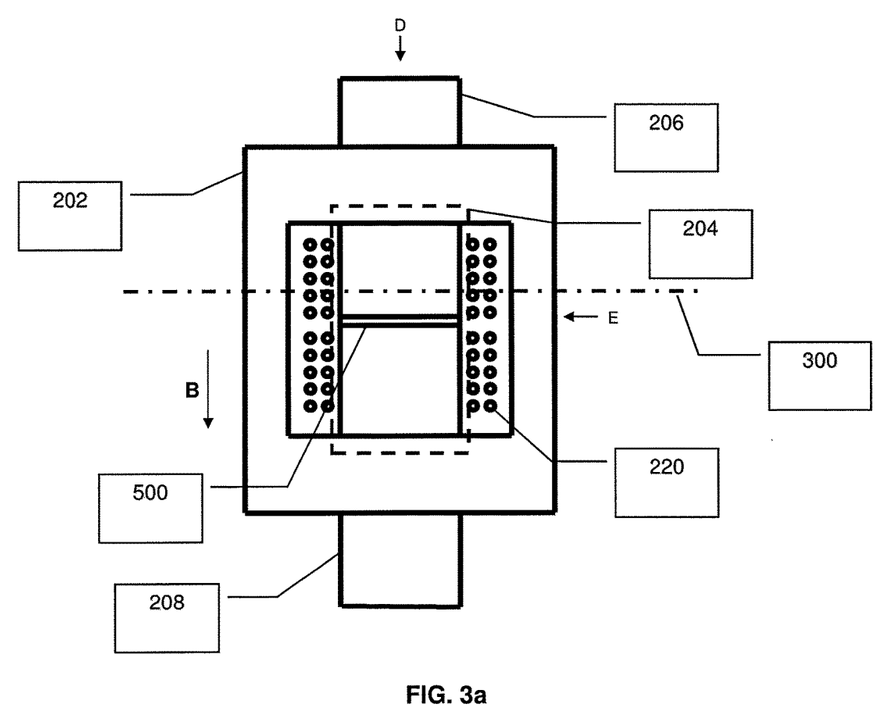

FIG. 3a is a top view of the substrate-indexer 200 without showing the top cover 222. It is seen that each of the opposite sides of the substrate carrier 202 parallel to the indexing direction B comprises a plurality of carrier openings 220 for introducing the shielding gas onto the substrate 204 during die bonding. In particular, the surface of the substrate carrier 202 is the surface for holding the substrate 204.

Figure 3B:
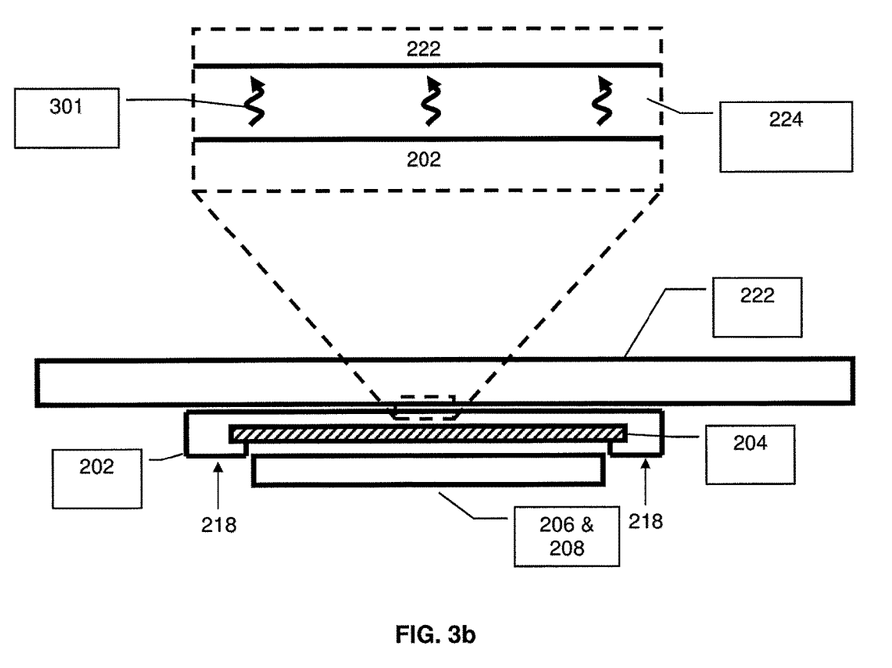
FIGS. 3b and 3c are different side views of the apparatus of FIG. 2 showing the top cover.
Figure 3C:
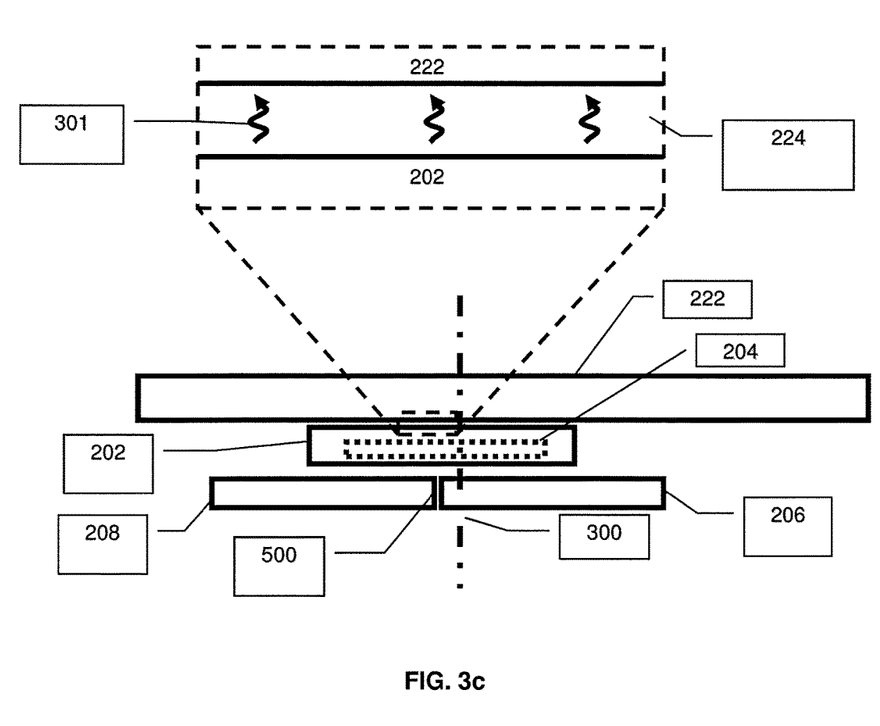

FIGS. 3b and 3c are different side views of the substrate-indexer 200 showing the top cover 222. It can be seen that the top cover 222 retains the shielding gas 301 within the space 224 between the top cover 222 and the substrate carrier 202. This retains the volume of shielding gas 301 that envelopes the top surface of the substrate 204, and inhibits the ingress of ambient air into the space 224. Advantageously, oxidation of the substrate 204 and the semiconductor dies bonded thereto can be minimised.

It is also seen from FIG. 3b that the substrate carrier 202 includes clamps 218 for clamping the substrate 204. By securing the substrate 204 in place as the anvil platform 216 is driven to press the heating and/or the cooling anvil blocks 206, 208 against different portions of the substrate 204, the desired effects of heating and/or cooling different portions of the substrate 204 could be more effectively achieved.

Optionally, the top cover 222 may include a slot, which is aligned with successive rows of the substrate bond pads as the substrate carrier 202 holding the substrate 204 is driven by the indexing mechanism 212 through the plurality of indexing positions. By providing the slot in the top cover 222, a die collet of a die bonder is movable through the top cover to reach the corresponding row of substrate bond pads for bonding thereto. Hence, the slot of the top cover 222 is aligned with a bonding line of the die bonder.

Figure 4:
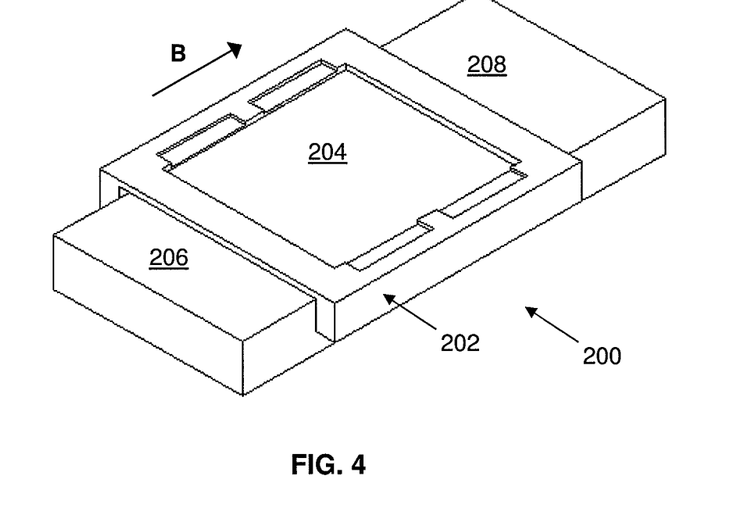
FIG. 4 shows a simplified version of the apparatus of FIG. 2.

FIG. 4 shows a simplified version of the substrate-indexer 200, comprising: i) the heating anvil block 206 for heating the substrate 204; ii) the cooling anvil block 208 for cooling the substrate 204; and iii) the substrate carrier 202 for indexing the substrate 204 first across the heating anvil block 206, and subsequently, across the cooling anvil block 208 in the indexing direction B.

Figure 5A:
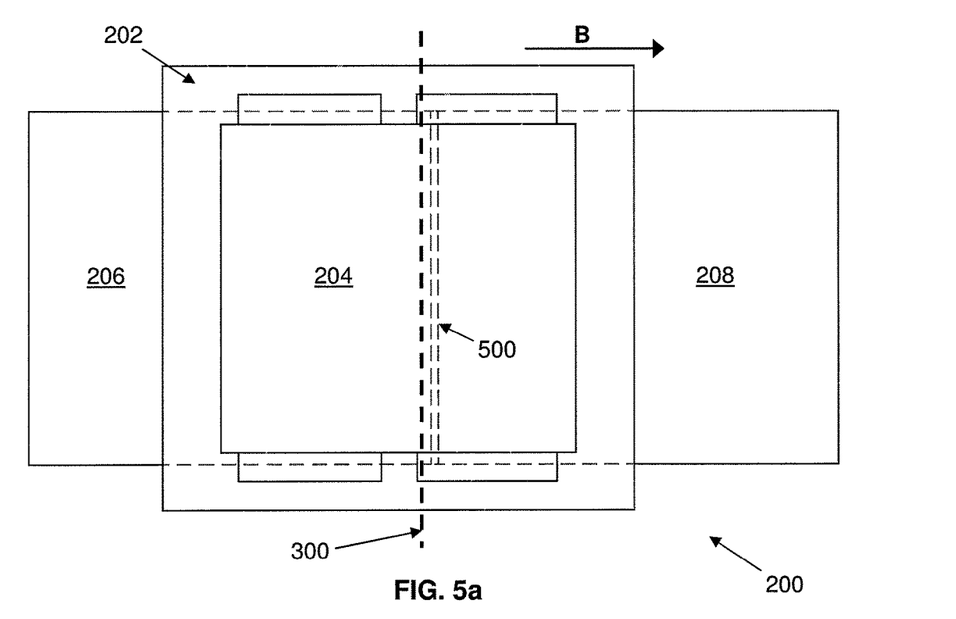
FIGS. 5a and 5b are top and side views of the apparatus of FIG. 4 respectively.
Figure 5B:
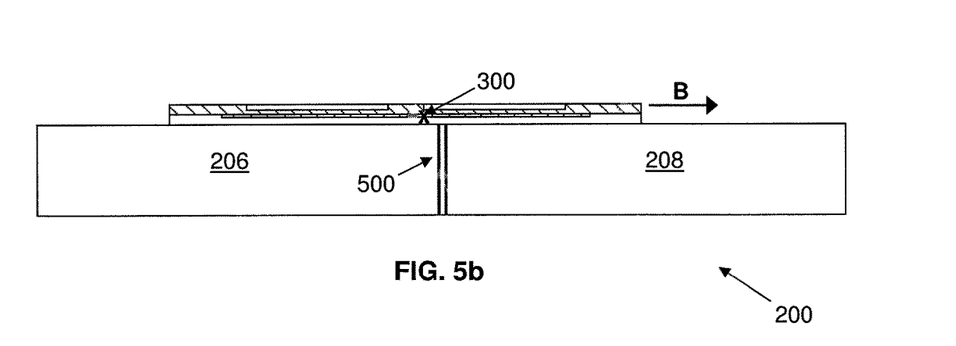

FIGS. 5a and 5b are top and side views of the substrate-indexer 200 of FIG. 4 respectively. To minimise unnecessary heat transfer between the heating and cooling anvil blocks 206, 208, an insulation medium 500 is provided between them. Examples of the suitable insulation media 500 include silica, ceramic fiber, and air.

In addition, it is seen from FIGS. 5a and 5b that the substrate-indexer 200 is configured such that the bonding line 300 is positioned above the heating anvil block 206, and in close proximity to the cooling anvil block 208. It should be noted that the bonding line 300 is fixed and does not vary throughout the die bonding process. This advantageously simplifies the construction and operation of the die bonder.

FIGS. 6a to 6d show an operation of the substrate-indexer 200.

Figure 6A:
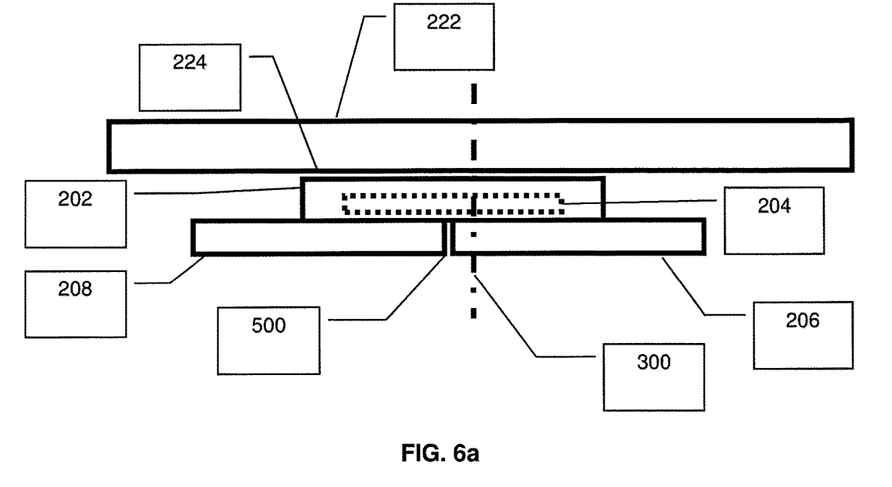
FIGS. 6a-6d show an operation of the apparatus of FIG. 4.

FIG. 6a shows the heating and cooling anvil blocks 206, 208 being driven to a top position to press against respective base portions of the substrate 204.

At this relative position between the substrate carrier 202 and the heating and cooling anvil blocks 206, 208, the bonding line 300 is aligned with a particular row of the substrate bond pad array. The substrate bond pads belonging to this particular row of substrate bond pad array would have already been subject to a desired duration of pre-bond heating by the heating anvil block 206 in the course of the substrate 204 being indexed by the indexing mechanism 212 across the heating anvil block 206 through a plurality of indexing positions. Accordingly, the temperature of each of these substrate bond pads would have already been elevated to the required temperature T1 (e.g. 280° C. if the die solder layer or bump is made of a gold-tin composite) at the time of bonding.

Regarding the rows of substrate bond pads located to the right of the bonding line 300 with reference to FIG. 6a, whether they have been sufficiently heated by the heating anvil block 206 for die bonding depends on their respective distances from the bonding line 300. Whereas one or more successive rows of substrate bond pads located to the right of the bonding line 300 may have reached the required temperature T1 for die bonding, one or more successive rows of the substrate bond pads from the extreme right of the substrate 204 in FIG. 6a may require further heating by the heating anvil block 206 to reach the required temperature T1 for die bonding.

Likewise, whether the rows of substrate bond pads located to the left of the bonding line 300 with reference to FIG. 6a have been sufficiently cooled by the cooling anvil block 208 after die bonding depends on their respective distances from the bonding line 300. Whereas one or more successive rows of substrate bond pads further away from the heating anvil block 206 may have already been sufficiently cooled to a post-bond cooling temperature T2 such that T2<T1 (e.g. below 200° C.) by the cooling anvil block 208, one or more successive rows of substrate bond pads nearer to the heating anvil block 206 may require further cooling by the cooling anvil block 208 to reach the required post-bond cooling temperature T2.

Figure 6B:
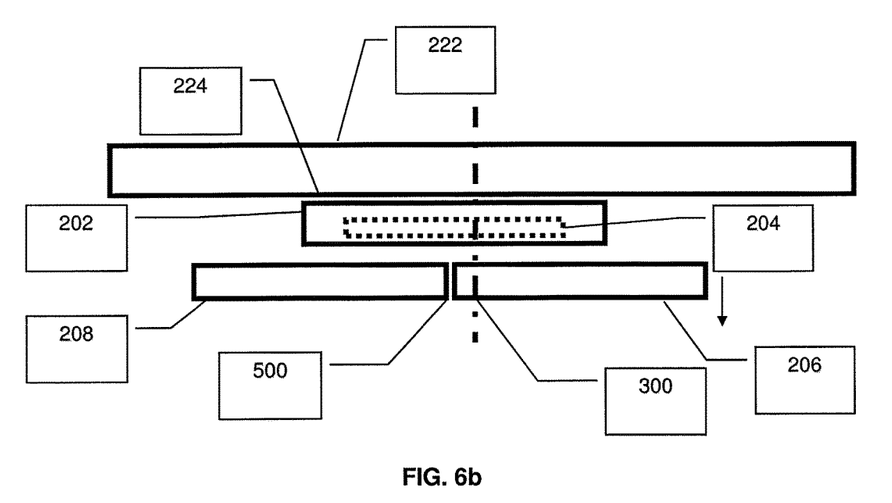

FIG. 6b shows that after the bonding of semiconductor dies has been completed along that particular row of substrate bond pads, the heating and cooling anvil blocks 206, 208 are driven to a bottom position to separate from the substrate carrier 202—and, hence, the substrate 204. This thus terminates contact between the substrate 204 and the heating and cooling anvil blocks 206, 208.

Figure 6C:
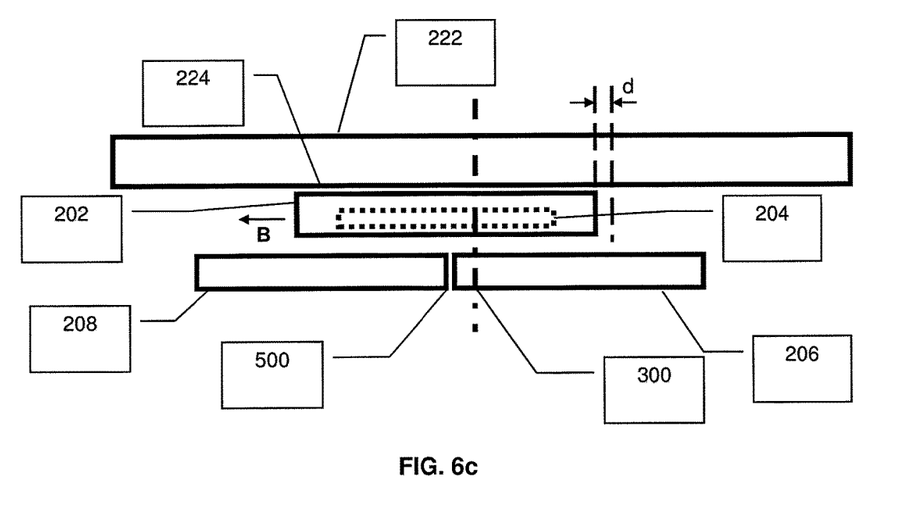

Subsequently, the substrate carrier 202 is indexed by the indexing mechanism 212 by a distance of a bond pad pitch d along the indexing direction B shown in FIG. 6c. Thus, the substrate 204 that is held by the substrate carrier 202 is accordingly indexed through a distance of one bond pad pitch d. It should be appreciated that this distance of one bond pad pitch d corresponds to the distance between adjacent rows of substrate bond pads of the substrate 204.

Figure 6D:
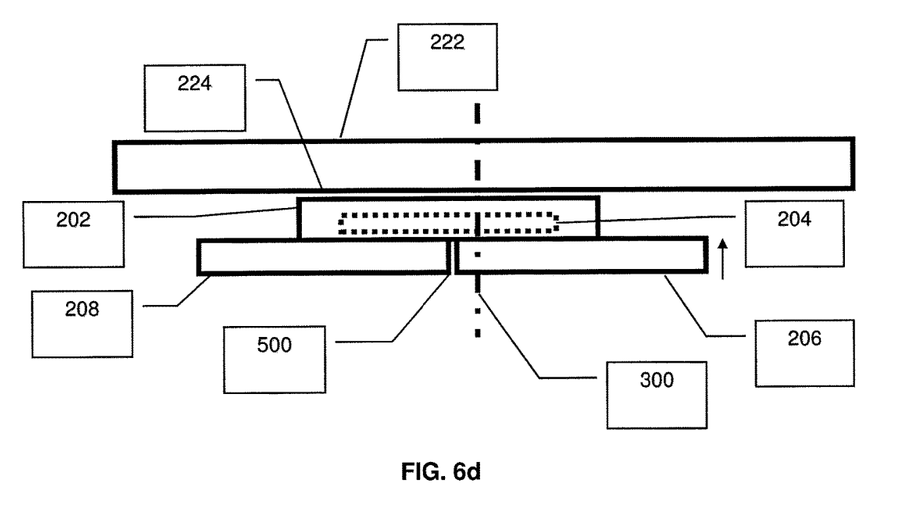

After the substrate carrier 202 has been indexed by the distance of one bond pad pitch d, the heating and cooling anvil blocks 206, 208 are driven back to the top position to press against the respective base portions of the substrate 204, as shown in FIG. 6d. This aligns the bonding line 300 with another row of substrate bond pads for die bonding.

It should be appreciated the cycle of the substrate-indexer's 200 operation described with reference to FIGS. 6a-6d is successively performed, starting with an initial position of the substrate carrier 202 at the right of the heating anvil block 206 to heat a first row of substrate bond pads, and ending with a final position of the substrate carrier 202 at the left of the cooling anvil block 208 to cool a final row of substrate bond pads.

By using the substrate-indexer 200 to index the substrate 204 during die bonding, the pre-bond heating time of each substrate bond pad is kept consistent for heating to the desired temperature T1 (e.g. 280° C. if the die solder layer or bump is made of a gold-tin composite) for die bonding. Similarly, the post-bond cooling time of each substrate bond pad is also kept consistent for cooling the substrate bond pad to a temperature T2 such that T2<T1 (e.g. below 200° C.) after a semiconductor die has been bonded thereto. Thus, the substrate-indexer 200 provides control of a temporal temperature profile for each of the substrate bond pads. This advantageously reduces the likelihood of damage to the internal mechanical structure of the semiconductor dies, as may be the case with the conventional indexing apparatus 100 in which the entire substrate 102 is placed on a heated anvil throughout the entire die bonding process. Moreover, by separating the heating and cooling anvil blocks 206, 208 from the substrate carrier 202 before indexing the substrate carrier 202 to a new position, the substrate-indexer 200 also prevents the substrate 204 from being scratched by the heating and cooling anvil blocks 206, 208, especially if the substrate 204 is made of ceramic material. In addition, the substrate carrier 202 advantageously provides a convenient means of indexing the substrate 204 across the heating and cooling anvil blocks 206, 208, compared with the use of indexing pins. This is because the use of indexing pins is usually package-specific, and their construction is typically complex in terms of various design parameters such as the pitch, the position and the stroke of the indexing pins.

The substrate-indexer 200 is particularly, but not exclusively, applicable for indexing the substrate 204 for eutectic die bonding. Various embodiments of the substrate-indexer 200 can be envisaged without departing from the scope of the claimed invention. For instance, the substrate-indexer 200 may comprise a plurality of heating anvil blocks 206 at different heating temperatures for heating the substrate 204, and/or a plurality of cooling anvil blocks 208 at different cooling temperatures for cooling the substrate 204. In addition, cooling fluids (e.g. cooling air or cooling water) may be used in place of the cooling anvil block 208 for cooling the substrate 204. Moreover, the positioning device of the substrate-indexer 200 may instead be configured to index the heating and cooling anvil blocks 206, 208 in an opposite direction to the indexing direction B, and to move the substrate carrier 202 vertically between top and bottom positions during die bonding. In this instance, however, the position of the bonding line 300 is not fixed but has to move together with the heating and cooling anvil blocks 206, 208 as the semiconductor dies are bonded to successive rows of the substrate bond pads.

The invention claimed is:

1. An apparatus for heating a substrate during die bonding, the apparatus comprising:
    a substrate carrier configured to hold the substrate;
    a heating device comprising a heating surface configured to successively contact and heat a different portion of the substrate at a time;
    a first actuator for effecting relative motion between the substrate carrier and the heating device such that the substrate is relatively indexed with respect to the heating device in an indexing direction;
    a cooling device comprising a cooling surface located adjacent to the heating device in the indexing direction after the heating device, wherein the cooling surface is movable relative to the substrate to contact and cool a second portion of the substrate to cool the second portion of the substrate contacted by the cooling device while the heating portion contacts and heats a first portion of the substrate which is different from the second portion, the second portion of the substrate having been previously contacted and heated by the heating surface; and
    a second actuator for effecting relative motion between the substrate carrier and the heating surface and the cooling surface in directions transverse to the indexing direction so as to contact the heating and cooling surfaces to the substrate at the same time to successively heat and cool different portions of the substrate, and
    to separate the heating and cooling surfaces from the substrate in order for the first actuator to move the substrate across the heating and cooling devices so as to relatively index the substrate across the heating and cooling devices.

2. The apparatus of claim 1, wherein the second actuator is coupled to the heating device, and is configured to move the heating device away from and towards the substrate.

3. The apparatus of claim 2, wherein the first actuator is coupled to the substrate carrier, and is configured to move the substrate carrier across a portion of the heating device after the heating device is moved away from the substrate by the second actuator.

4. The apparatus of claim 1, wherein the substrate carrier comprises a plurality of clamps for clamping the substrate to the substrate carrier.

5. The apparatus of claim 1, wherein the substrate carrier is connected to a source of shielding gas, and the substrate carrier further comprises a plurality of openings for introducing the shielding gas over the substrate.

6. The apparatus of claim 5, wherein the plurality of openings are arranged along at least one side of a surface of the substrate carrier, the surface of the substrate carrier being for holding the substrate.

7. The apparatus of claim 5, further comprising a cover arranged over the substrate carrier for retaining the shielding gas over the substrate.

8. The apparatus of claim 1, wherein the cooling device is operable for cooling the different portions of the substrate after the respective different portions of the substrate have been heated by the heating device.

9. The apparatus of claim 8, wherein the cooling device is a cooling anvil block.

10. A method of heating a substrate during die bonding, the method comprising the steps of:
    contacting a heating surface of a heating device against a first portion of the substrate to heat the first portion of the substrate;
    while contacting the heating surface of the heating device against the first portion of the substrate, contacting a cooling surface of a cooling device against a second portion of the substrate to cool the second portion of the substrate which is different from the first portion of the substrate being contacted by the heating surface, the second portion of the substrate having been previously contacted and heated by the heating surface;

separating the heating and cooling surfaces from the substrate;

indexing the substrate in an indexing direction by moving the substrate across the heating and cooling devices after the heating and cooling surfaces have been separated from the substrate; and contacting the heating and cooling surfaces against the substrate again to heat and cool different portions of the substrate;

wherein the cooling device is located adjacent to the heating device in the indexing direction after the heating device, and wherein the steps of contacting the heating surface against the substrate and separating the heating and cooling surfaces from the substrate are conducted in directions transverse to the indexing direction.

11. The method of claim 10, wherein the step of separating the heating device from the substrate comprises moving the heating device away from the substrate.

12. The method of claim 11, wherein the step of indexing the substrate relatively across the heating device comprises moving the substrate across a portion of the heating device after moving the heating device away from the substrate.

13. The method of claim 10, wherein the step of contacting the heating device against the substrate comprises moving the heating device towards the substrate.

14. The method of claim 10, further comprising the step of cooling the portion of the substrate after the portion of the substrate has been heated by the heating device.

* * * * *